United States Patent
Feudel et al.

(10) Patent No.: US 6,849,516 B2
(45) Date of Patent: Feb. 1, 2005

(54) METHODS OF FORMING DRAIN/SOURCE EXTENSION STRUCTURES OF A FIELD EFFECT TRANSISTOR USING A DOPED HIGH-K DIELECTRIC LAYER

(75) Inventors: Thomas Feudel, Radebeul (DE); Manfred Horstmann, Dresden (DE); Karsten Wieczorek, Dresden (DE); Stephan Kruegel, Boxdorf (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/442,745

(22) Filed: May 21, 2003

(65) Prior Publication Data

US 2004/0104442 A1 Jun. 3, 2004

(30) Foreign Application Priority Data

Nov. 29, 2002 (DE) ......................................... 102 55 849

(51) Int. Cl.[7] .................. H01L 21/336; H01L 21/3205
(52) U.S. Cl. ...................... 438/303; 438/305; 438/307; 438/306; 438/301; 438/595
(58) Field of Search ................................. 257/410, 344, 257/411, 408; 438/216, 301, 261, 766, 421, 199, 591, 143, 595, 287, 954, 981, 303, 304, 305, 307, 306

(56) References Cited

U.S. PATENT DOCUMENTS

| | | | |
|---|---|---|---|
| 4,994,869 A | 2/1991 | Matloubian et al. | 357/23.3 |
| 5,518,945 A * | 5/1996 | Bracchitta et al. | 438/307 |
| 5,599,734 A * | 2/1997 | Byun et al. | 438/143 |
| 5,770,490 A * | 6/1998 | Frenette et al. | 438/199 |
| 5,926,715 A | 7/1999 | Fan et al. | 438/305 |
| 6,200,869 B1 | 3/2001 | Yu et al. | 438/301 |
| 6,255,152 B1 * | 7/2001 | Chen | 438/199 |
| 2001/0038123 A1 | 11/2001 | Yu | 257/344 |
| 2003/0082922 A1 * | 5/2003 | Lee et al. | 438/766 |

FOREIGN PATENT DOCUMENTS

DE 44 09 875 C2 12/1995 ......... H01L/21/336

\* cited by examiner

*Primary Examiner*—Steven Loke
(74) *Attorney, Agent, or Firm*—Williams, Morgan & Amerson, P.C.

(57) ABSTRACT

According to one illustrative embodiment of the present invention, a method of forming a field effect transistor includes the formation of a doped high-k dielectric layer above a substrate including a gate electrode formed over an active region and separated therefrom by a gate insulation layer. A heat treatment is carried out with the substrate to diffuse dopants from the high-k dielectric layer into the active region to form extension regions. The high-k dielectric layer is patterned to form sidewall spacers at sidewalls of the gate electrode and an implantation process is carried out with the sidewall spacers as implantation mask to form source and drain regions.

28 Claims, 3 Drawing Sheets

METHODS OF FORMING DRAIN/SOURCE EXTENSION STRUCTURES OF A FIELD EFFECT TRANSISTOR USING A DOPED HIGH-K DIELECTRIC LAYER

BACKGROUND OF THE INVENTION

1. Field of the Invention

The present invention generally relates to the fabrication of integrated circuits, and, more particularly, to the fabrication of highly sophisticated field effect transistors, such as MOS transistor structures, requiring highly doped shallow junctions.

2. Description of the Related Art

The manufacturing process for integrated circuits continues to improve in several ways, driven by the ongoing efforts to scale down the feature sizes of the individual circuit elements. Presently, and in the foreseeable future, the majority of integrated circuits is and will be based on silicon devices due to the high availability of silicon substrates and due to the well-established process technology that has been developed over the past decades. A key issue in developing integrated circuits of increased packing density and enhanced performance is the scaling of transistor elements, such as MOS transistor elements, to provide the huge number of transistor elements that may be necessary for producing modern CPUs and memory devices. One important aspect in manufacturing field effect transistors having reduced dimensions is the reduction of the length of the gate electrode that controls the formation of a conductive channel separating the source and drain regions of the transistor. The source and drain regions of the transistor element are conductive semiconductor regions including dopants of an inverse conductivity type compared to the dopants in the surrounding crystalline active region, e.g., a substrate or a well region.

Although the reduction of the gate length is necessary for obtaining smaller and faster transistor elements, it turns out, however, that a plurality of issues are additionally involved to maintain proper transistor performance for a reduced gate length. One challenging task in this respect is the provision of shallow junction regions, i.e., source and drain regions, which nevertheless exhibit a high conductivity so as to minimize the resistivity in conducting charge carriers from the channel to a respective contact area of the drain and source regions. The requirement for shallow junctions having a high conductivity is commonly met by performing an ion implantation sequence so as to obtain a high dopant concentration having a profile that varies laterally and in depth. The introduction of a high dose of dopants into a crystalline substrate area, however, generates heavy damage in the crystal structure, and therefore one or more anneal cycles are required for activating the dopants, i.e., for placing the dopants at crystal sites, and to cure the heavy crystal damage. However, the dopant concentration is limited by the ability of the anneal cycles to electrically activate the dopants. This ability in turn is limited by the solid solubility of the dopants in the silicon crystal. Moreover, besides the dopant activation and the curing of crystal damage, undesired dopant diffusion also occurs during the annealing, which may lead to a "blurred" dopant profile. With reference to FIGS. 1a–1d, a typical conventional process flow for forming a conventional field effect transistor will now be described in order to explain the problems involved in more detail.

FIG. 1a schematically shows a cross-sectional view of a transistor structure 100 at an intermediate manufacturing stage. The transistor structure 100 comprises a substrate 101, typically a silicon substrate or a substrate including a silicon layer, in which an active region 103 is enclosed by shallow trench isolations (STI) 102. A gate electrode 105 is formed over the active region 103 and is separated therefrom by a gate insulation layer 106. It should be noted that the previously mentioned gate length is, in FIG. 1a, the lateral dimension of the gate electrode 105. The portion of the active region 103 underlying the gate insulation layer 106 represents a channel region 104 disposed between source and drain extension regions 108 that may also be referred to as "tip" regions.

A typical process flow for forming the transistor structure 100 as shown in FIG. 1a may comprise the following process steps. After formation of the shallow trench isolations 102 by sophisticated photolithography, etch and deposition methods, an implantation sequence is carried out to generate a required dopant profile (not shown) within the active region 103. Thereafter, the gate insulation layer 106 is formed by advanced oxidation and/or deposition methods with a required thickness that is matched to the gate length of the gate electrode 105. Then, the gate electrode 105 is patterned from a polysilicon layer by means of advanced photolithography and etch techniques. Next, an ion implantation, indicated by reference 107, is carried out to introduce dopants of a required conductivity type into the active region 103 to thereby form the extension regions 108. As previously noted, scaling the gate length of the gate electrode 105 also requires the extension regions 108 to be provided as shallow doped regions with a depth, indicated as 109, in the range of approximately 10–100 nm for a gate length in the range of approximately 30–200 nm. Thus, the ion implantation 107 is carried out with relatively low energy, depending on the type of dopants used, and with a high dose to provide for the required high dopant concentration within the extension regions 108.

FIG. 1b schematically shows the transistor structure 100 in an advanced manufacturing stage. Sidewall spacers 110 which are typically formed of silicon dioxide or silicon nitride are formed at sidewalls of the gate electrode 105. The sidewall spacers 110 are formed by self-aligned deposition and anisotropic etch techniques in order to act as implantation masks for a subsequent ion implantation sequence 112 to form source and drain regions 111.

As previously noted, a high dopant concentration is required in the source and drain regions 111, as well as in the extension regions 108, so that severe crystal damage is generated during the implantation sequences 107, 112. Therefore, a heat treatment, such as a rapid thermal anneal, is generally required, on the one hand, to activate the dopant atoms and to substantially recrystallize the damaged structure in the source and drain regions 111 and the extension regions 108. It turns out, however, that at high dopant concentrations, the electrical activation by rapid thermal anneal cycles is limited by the solid solubility of the dopants in the silicon crystal. Additionally, the dopants readily diffuse into undesired crystalline regions of the active regions 103, thereby significantly compromising the transistor performance. On the other hand, efficiently re-establishing the crystalline structure within the source and drain regions 111 and the extension regions 108 requires relatively high temperatures over a sufficiently long time period, which may, however, unduly increase the dopant diffusion. Consequently, a trade-off is made with respect to activating and curing the transistor structure 100. Especially as device dimensions are scaled to a gate length of 100 nm and even less, the issue of degraded transistor performance due to a reduced conductivity owing to insufficiently activated dopants and/or a dopant profile blurred by diffusion is even more emphasized.

FIG. 1c schematically shows the transistor structure 100 after completion of the manufacturing process. Metal silicide regions 115 are formed on top of the gate electrode 105 and the drain and source regions 111, which may comprise cobalt silicide or any other appropriate silicide of a refractory metal. Contact lines 113 are formed in contact with the drain and source regions 111 to provide electrical contact to further circuit elements (not shown) or other interconnect lines (not shown). The contact lines 113 may typically be comprised of tungsten and other appropriate barrier and adhesion material.

Forming the metal silicide regions 115 typically involves the deposition of an appropriate refractory metal and subsequently a suitably designed anneal cycle to obtain the metal silicide regions 115 having a significantly lower sheet resistance than silicon, even when being heavily doped. Forming the contact lines 113 is carried out by depositing a dielectric layer (for convenience not shown) and patterning the same to form vias that are subsequently filled with a metal, wherein a thin barrier and adhesion layer is typically formed prior to filling in the bulk metal.

During operation of the transistor structure 100, a voltage may be applied to the contact lines 113 and a corresponding control voltage to the gate electrode 105 so that, in the case of an N-channel transistor, a thin channel forms in the channel region 104 substantially comprised of electrons, indicated by 114, wherein, as previously noted, the transistor performance, among others, significantly depends on the transition resistance from the channel 104 to the extension regions 108 and from the sheet resistance in the regions 108, since substantially no metal silicide is formed in this area. Owing to the difficulties in forming the extension regions 108 and the drain and source regions 111, i.e., insufficiently cured lattice damage and restricted concentration of activated dopants, the device performance is degraded, especially for extremely scaled transistor elements 100, thereby partially offsetting the advantages that are generally obtained by scaling the circuit elements of an integrated circuit.

In view of the above problems, there exists a need for an improved technique in forming field effect transistor structures that avoids or at least significantly reduces the problems identified above.

SUMMARY OF THE INVENTION

The present invention generally relies on the fact finding that sidewall spacers made of a dielectric material exhibiting a high permittivity, which are formed on the sidewalls of the gate electrode, may promote charge carry accumulation in the underlying conductive region, as has been shown by computer simulation. This advantageous effect may be combined with a high dopant concentration obtained by out-diffusion of dopants from the dielectric material of the sidewall spacers into the underlying extension region, thereby avoiding an implantation step and thus significantly improving the overall conductivity of a transistor element.

According to one illustrative embodiment of the present invention, a method of forming a field effect transistor comprises the formation of a doped high-k dielectric layer above a substrate including a gate electrode formed over an active region and separated therefrom by a gate insulation layer. A heat treatment is carried out with the substrate to diffuse dopants from the high-k dielectric layer into the active region to form extension regions. The high-k dielectric layer is patterned to form sidewall spacers at sidewalls of the gate electrode and an implantation process is carried out with the sidewall spacers as implantation mask to form source and drain regions.

According to a further illustrative embodiment of the present invention, a method of forming a field effect transistor comprises performing an ion implantation process to form source and drain regions in an active region provided on a substrate that includes a gate electrode formed over the active region and separated therefrom by a gate insulation layer, wherein the gate electrode has sidewall spacers formed on sidewalls thereof, which act as an implantation mask. Next, the sidewall spacers are removed and a doped high-k dielectric layer is formed. The substrate is then subjected to a heat treatment to diffuse dopants from the high-k dielectric layer into underlying regions, thereby also at least partially activating atoms introduced by the implantation process. Moreover, the high-k dielectric layer is patterned to form high-k sidewall spacers on the gate electrode.

In accordance with still another illustrative embodiment of the present invention, a method of forming a shallow conductive doped semiconductor region below a dielectric region comprises the formation of a dielectric layer over a substrate including the semiconductor region, wherein the dielectric layer comprises an oxide of tantalum and/or zirconium and/or hafnium and/or lanthanum and/or yttrium and/or strontium. A dopant is introduced in the dielectric layer and the substrate is annealed to diffuse dopants into the semiconductor region. The dielectric layer is then patterned to form a dielectric region above the doped semiconductor region, wherein a charge carrier accumulation below the dielectric region is enhanced in the presence of an external electric field.

In accordance with yet another illustrative embodiment of the present invention, a field effect transistor comprises a gate electrode formed above an active semiconductor region and separated therefrom by a gate insulation layer. Doped high-k dielectric spacer elements are formed on sidewalls of the gate electrode and over a portion of the semiconductor region. A dopant concentration, at least at a part of an interface between the spacer elements and the semiconductor region, is, in the spacer elements, equal, or higher than, in the semiconductor region.

BRIEF DESCRIPTION OF THE DRAWINGS

The invention may be understood by reference to the following description taken in conjunction with the accompanying drawings, in which like reference numerals identify like elements, and in which.

Figure 1A:
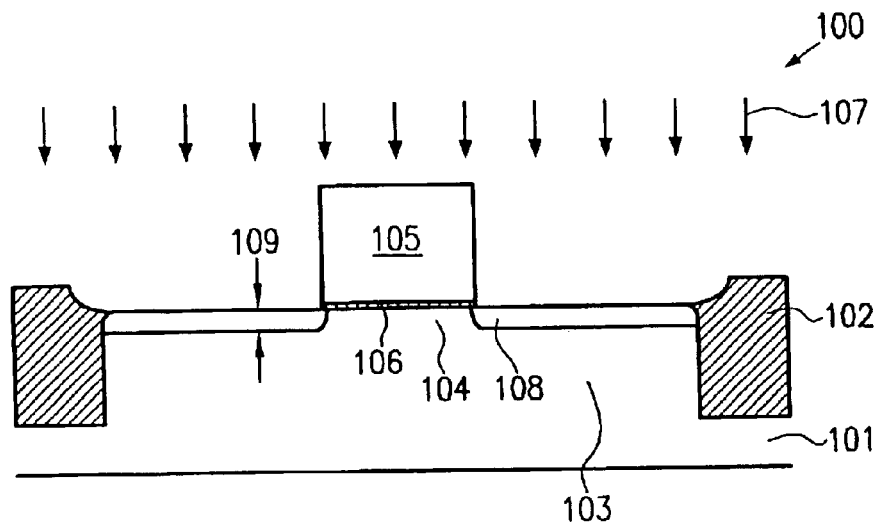
FIGS. 1a–1c schematically show cross-sectional views of a transistor structure during various manufacturing stages of a typical conventional process flow.
Figure 1B:
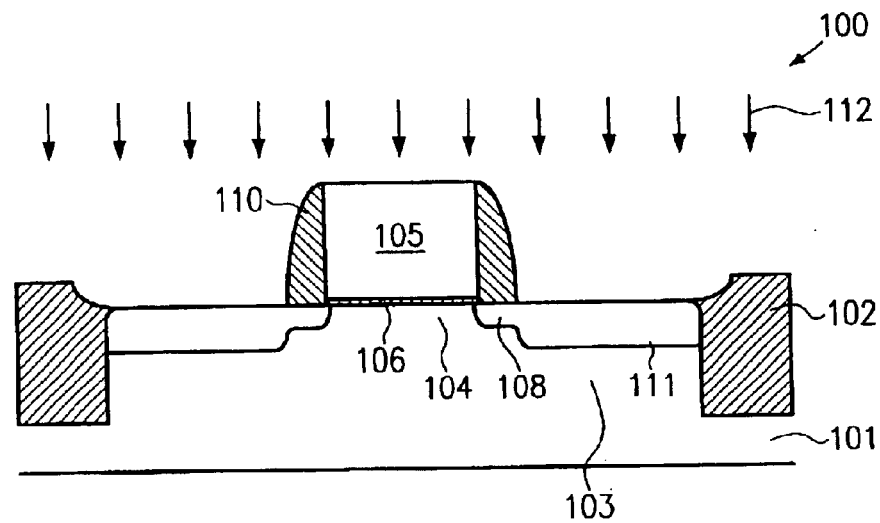

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

With reference to FIGS. 2a–2f, further illustrative embodiments of the present invention will now be described, wherein a semiconductor region having a high degree of dopant concentration is obtained with a minimum of crystal damage, and a dielectric layer is provided above the highly doped semiconductor region so that, in the presence of an external electric field, an increased charge carrier accumulation is created due to the increased permittivity. In this respect, the term "high-k" dielectric layer or material is meant to specify any material exhibiting a permittivity that exceeds the permittivity of the commonly used dielectric materials silicon dioxide and silicon nitride which, depending on the process technique for forming a dielectric layer, may lie in the range of approximately 3.5 to 7.5. Thus, in the following specification, as well as in the appended claims, the term "high-k" relates to a relative permittivity of approximately 8 and more unless otherwise specified. It should further be added that the present invention may advantageously be used for the formation of field effect transistors and especially for improved extension regions exhibiting a higher conductivity than conventional devices. However, the principles of the present invention are also applicable to the formation of other circuit elements requiring a high conductivity in a relatively shallow doped semiconductor region.

Figure 2A:
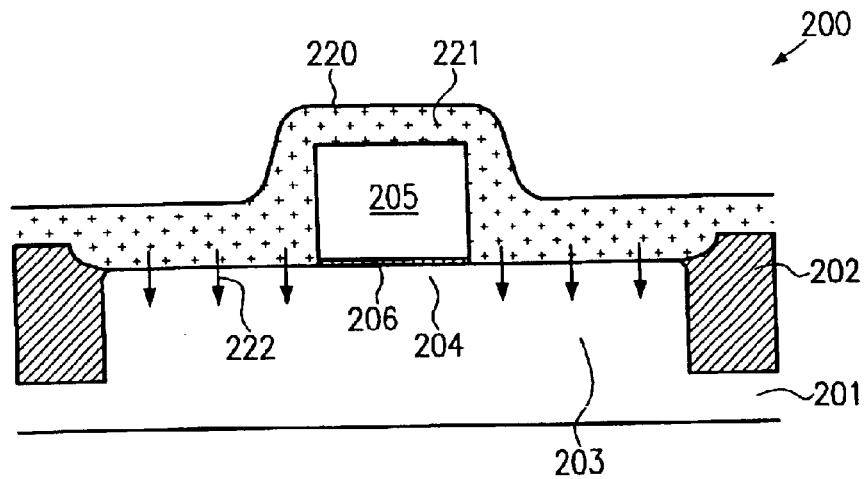
FIGS. 2a–2f schematically show cross-sectional views of a semiconductor structure in the form of a transistor structure during various manufacturing stages in accordance with illustrative embodiments of the present invention.

FIG. 2a schematically shows a transistor structure 200 including a substrate 201, which may be a silicon substrate, a silicon-on-insulator (SOI) substrate, or any other appropriate substrate as long as it is capable of bearing an active semiconductor region 203. The active region 203 is enclosed by an isolation structure 202, which is provided in the present example in the form of a shallow trench isolation (STI) structure. A gate electrode 205, for example comprised of polysilicon or any other appropriate gate electrode material, is formed above the active region 203 and is separated therefrom by a gate insulation layer 206. The lateral dimension of the gate electrode 205, referred to as gate length, substantially defines a channel region 204 in the active region 203. In some embodiments, the gate length is in the range of approximately 30–200 nm. Furthermore, a dielectric layer 220 is formed over the transistor structure 200 with a thickness that is designed to form sidewall spacer elements in a subsequent process step. The dielectric layer 220 comprises a high-k material, such as oxides or silicates of tantalum, zirconium, hafnium, and the like, which typically have a relative permittivity of approximately 10–20 or more. Other appropriate high-k materials may include oxides formed of lanthanum, yttrium, strontium, and the like, which have a relative permittivity greater than 20. The dielectric layer 220 further comprises dopants 221 of a required conductivity type, such as arsenic and/or phosphorous atoms as N-type dopants, or boron and/or indium as P-type dopants. The concentration of the dopants 221 in the dielectric layer 220 is in one particular embodiment in the range of the solid solubility of the dopants 221 within the material of the dielectric layer 220, or may even be higher as the respective solid solubility. In other embodiments, however, the concentration of the dopants 221 is adjusted to any appropriate level required for the further processing of the semiconductor structure 200.

A typical process flow for the fabrication of the transistor structure 200, as shown in FIG. 2a, may include the following processes. The formation of the active region 203, the isolation structures 202, the gate insulation layer 206 and the gate electrode 205 may involve substantially the same steps as already described with reference to FIG. 1a. Contrary to the conventional process flow, the dielectric layer 220 comprising the high-k dielectric material is then deposited by any appropriate deposition method, such as a chemical vapor deposition (CVD) or physical vapor deposition (PVD) process. During the deposition of the dielectric layer 220, the deposition atmosphere may be controlled in such a way that the dopants 221 are introduced into the dielectric layer 220 with the required concentration. For example, any precursor gases including the dopants may be added to the deposition atmosphere, wherein, for example, the flow rate of the respective precursor gas is controlled to finally obtain the required dopant concentration.

In other embodiments, the deposition of the dielectric layer 220 may be carried out in accordance with well-established deposition recipes and subsequently the dopants 221 may be introduced into the dielectric layer 220 by any suitable technique. For instance, an implantation sequence may be carried out to introduce the dopants 221 into the dielectric layer. In other embodiments, an additional diffusion layer (not shown) may be formed over the dielectric layer 220 and the dopants 221 may then be introduced into the dielectric layer 220 by annealing the transistor structure 200. Irrespective of the method chosen, the dopant concentration of the dielectric layer 220 after the dopants are introduced may be approximately $10^{19}$–$10^{21}$ atoms/cm$^3$.

Thereafter, a portion of the dopants 221 may be introduced into the active region 203 by carrying out a heat treatment, for example by annealing a substrate with a temperature in the range of approximately 800–1200° C. for a time period of approximately 10 seconds to 30 minutes, depending on the material used in the dielectric layer 220, the type of dopants 221, the required penetration depth of the dopants 221, and the like.

The out-diffusion of the dopants 221 into the active region 203, as indicated by reference 222, allows the establishment of the required dopant concentration in the active region 203, by a process that may be controlled by the dopant concentration in the dielectric layer 220 and mainly by the process parameters of the anneal cycle, substantially without damaging the crystal structure of the active region 203.

Figure 2B:
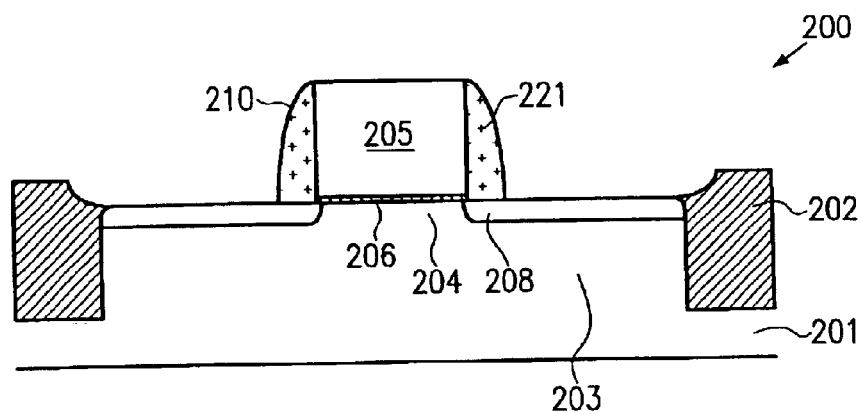

FIG. 2b schematically shows the transistor structure 200 after completion of the thermal treatment for introducing the dopants 221 into the active region 203 to thereby form extension regions 208. In some embodiments, the dopant concentration may be approximately $10^{19}$–$5\times10^{20}$ atoms cm$^{-3}$. Sidewall spacers 210 are formed on sidewalls of the gate electrode 205, which have been formed in accordance with a conventional anisotropic etch process.

Figure 2C:
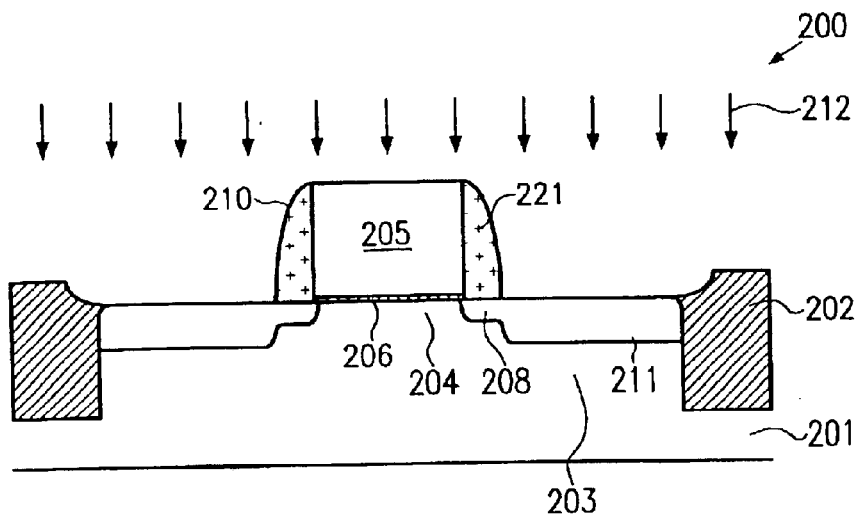

FIG. 2c schematically shows the transistor structure 200 in a further advanced manufacturing state. Source and drain regions 211 are formed in the active region 203 by an implantation process, indicated by reference 212. As previously noted, by carrying out the implantation process 212, dopants of the required conductivity type are introduced to a specified depth of the active region 203, so as to form the source and drain regions 211 partially in and below the extension regions 208, where a dopant profile is obtained as required for a specified transistor performance. Typical energies for doping the drain and source regions 211 may be, depending on the type of dopant, such as arsenic, phosphorus, boron, indium, and the like, in the range of approximately 30–90 keV with a dose in the range of approximately $10^{15}$–$10^{16}$ ions per cm$^2$.

After the ion implantation 212, a heat treatment is carried out so as to activate the dopants introduced by the implantation 212 and to cure lattice damage caused by the ion bombardment. For example, the anneal process may be performed at a temperature ranging from approximately 900–1200° C. and for a duration of approximately 10–300 seconds. During this anneal cycle, further dopants 221 may also be introduced into the extension region 208 and/or the dopants in the extension region 208 are also activated, i.e., are transferred to lattice sites. It should be noted that typically anneal cycles are performed under thermal equilibrium conditions so that the achievable dopant activation is determined by the solid solubility of the dopants in the crystalline region of the active region 203, unless non-equilibrium anneal processes are carried out, such as laser annealing and the like. By providing a relatively high dopant concentration in the extension regions 208 by introducing the dopants 221 from the dielectric layer 220 and/or the spacer elements 210, at least the extension region 208 covered by the spacer 210 exhibits minimum crystal damage and thus exhibits a significantly improved conductivity compared to a conventional device, even if the degree of doping is limited by the solid solubility as in a conventional device, since charge carrier scattering by non-cured crystalline defects is remarkably reduced, as will be described in more detail below.

Figure 2D:
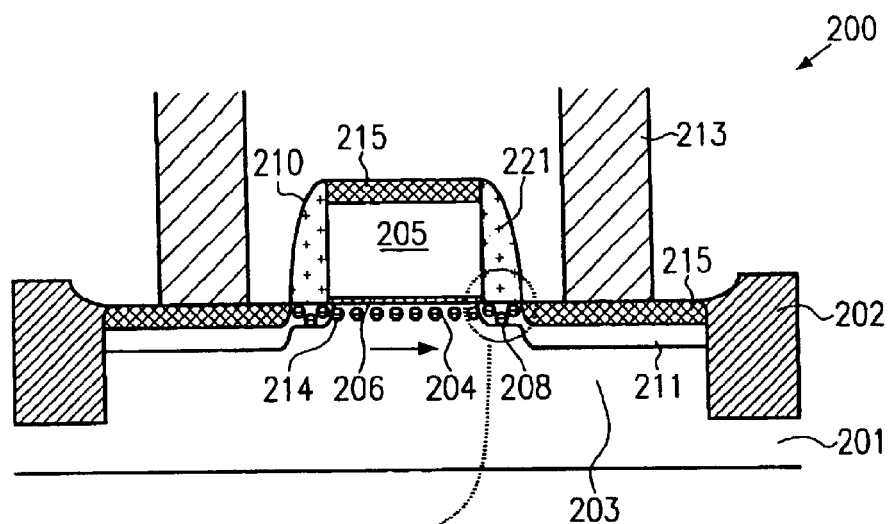

FIG. 2d schematically shows the completed transistor structure 200. Metal silicide regions 215 are formed on the gate electrodes 205 and on upper portions of the drain and source regions 211. Moreover, contact lines 213 are provided and electrically connect the source and drain regions 211 to other circuit elements (not shown) and/or other conductive lines (not shown).

Figure 1C:
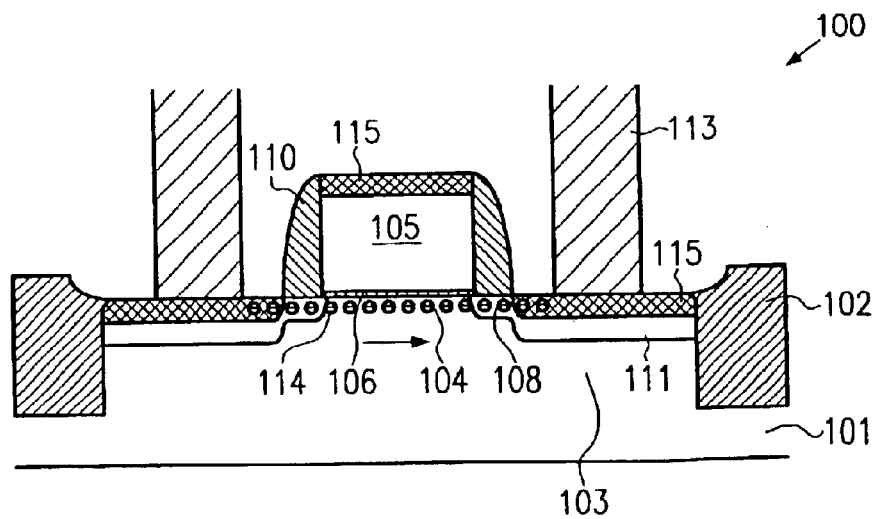

The process steps for forming the transistor structure 200 as shown in FIG. 2d may be similar to those already described with reference to FIG. 1c, so that a corresponding description thereof will be omitted here.

In operation, a control voltage supplied to the gate electrode 205 and a corresponding operation voltage supplied to the source and drain regions 211 via the contact lines 213 establishes a current flow, indicated as 214, in the channel region 204 between the source and drain. For convenience, an N-type field effect transistor is shown, whereas it is to be understood that substantially the same criteria apply to a P-channel transistor. As already explained, the reduced defect rate in a portion 230 of the extension region 208 leads to an enhanced conductivity due to the reduction in charge carrier scattering. Moreover, the high permittivity of the sidewall spacers 210 allows an increased capacitive coupling to the underlying extension region 208, thereby promoting a charge carrier accumulation in the portion 230. Due to the high dopant concentration in the extension region 208, that may be in the range of the solid solubility, in combination with the enhanced capacitive coupling, the charge carrier concentration may well exceed the order of magnitude determined by the solid solubility, which is typically in the range of 3×20 per cubic centimeter. Thus, even for a dopant concentration in the extension region 208 that is comparable to a conventional device, an improved charge carrier density may be accomplished by the present invention, wherein additionally a reduced defect level may also contribute to an enhanced conductivity. This allows extremely shallow extension regions 208 without compromising the transistor performance.

Figure 2E:
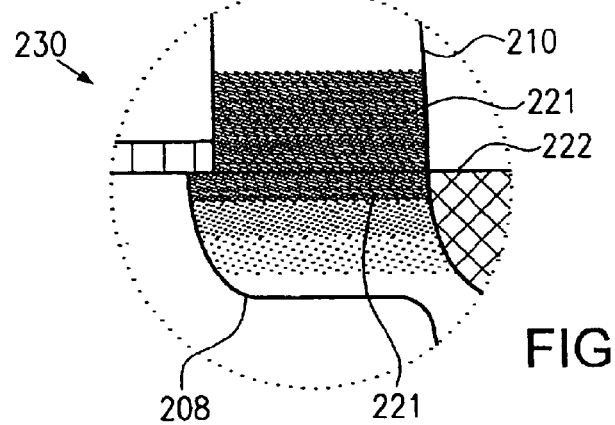

FIG. 2e is a schematic magnification of the portion 230. As can be seen from FIG. 2e, the concentration of the dopants 221 in the vicinity of an interface 222 between the spacer element 210 and extension region 208 is substantially equal or higher than the corresponding dopant concentration in the extension region 208 due to the diffusion mechanism. A substantially equal concentration on both sides of the interface 222 is obtained when the anneal cycles carried out to out-diffuse the dopants 221 into the extension region 208 are performed sufficiently long to "deplete" the spacer element 210 (or the dielectric layer 220 (FIG. 2a)), and to accumulate the dopants within the extension region 208 until approximately an equilibrium is obtained at the interface 222. Especially, when the initial dopant concentration in the spacer element 210 is selected to exceed the limit of the solid solubility of the spacer material and of the underlying active region 203, a high dopant concentration approximately of the order of the solid solubility and the active region 203 may be obtained by diffusing the dopant 221 into the extension region 208. Moreover, in conventional process flows, the dopant concentration in the extension regions is usually decreased during required anneal cycles, for example for activating dopants and curing crystal damage after formation of the drain and source regions owing to an undesired out-diffusion of dopants. In accordance with the illustrative embodiments of the present invention described above, however, the dopant concentration during these anneal cycles may substantially be maintained or may even be increased due to the high dopant concentration at the interface 222, since dopants 221 are continuously provided by the doped spacer elements 210 as long as the concentration therein is higher than in the underlying extension regions 208.

It should be noted that in the illustrative embodiments described above, the out-diffusion of the dopants 221 into the active region 203 substantially occurs from the dielectric layer 220 (FIG. 2a) into the underlying substrate regions. In other embodiments, it may be considered preferable to first pattern the dielectric layer 220 without carrying out any anneal cycles and introduce the dopants 221 into the active region 203 after the formation of the spacer elements 210, for example during the anneal cycle required after the implantation process 212 (FIG. 2c) in forming the source and drain regions 211.

In other illustrative embodiments of the present invention, the source and drain regions 211 may be formed prior to forming the extension regions 208 by forming corresponding sidewall spacer elements (not shown) that may comprise the conventional low-k material such as silicon dioxide and/or silicon nitride and removing the sidewall spacers after the ion implantation process for forming the drain and source regions 211. Thereafter, the process sequence may be continued as described with reference to FIG. 2a, wherein the introduction of the dopants 221 from the dielectric layer 220 and/or from the spacer elements 210 may be carried out in a separate or in a common anneal cycle used for activating the dopants in the drain and source regions 211 (note that the implantation sequence 212 shown in FIG. 2c is then no longer required).

Figure 2F:
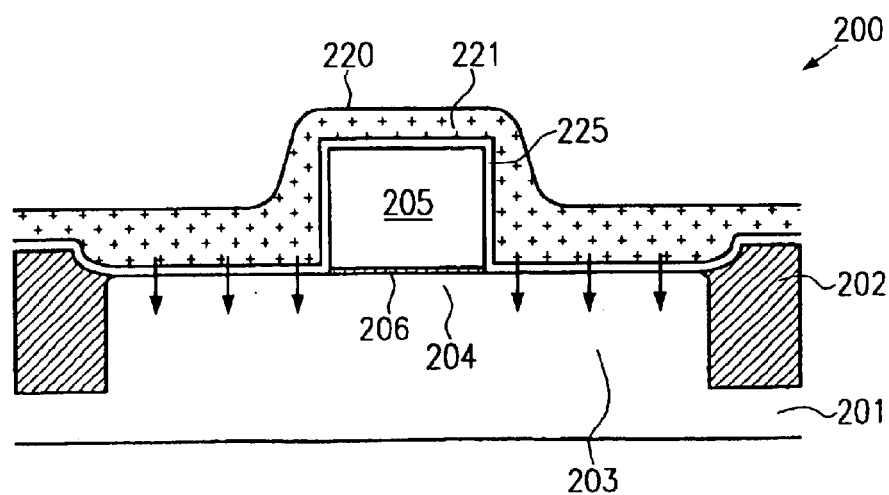

FIG. 2f shows the transistor structure 200 in an early manufacturing stage in accordance with a further illustrative embodiment of the present invention. The transistor structure 200 is quite similar to the structure shown in FIG. 2a and additionally comprises a barrier layer 225 formed below the dielectric layer 220. The barrier layer 225 may include a low-k dielectric material that exhibits superior characteristics for preventing undue diffusion of dielectric material of the layer 220 into the underlying active region 203 and/or the adjacent gate electrode 205, without unduly slowing down the diffusion of the dopants 221 into the active region 203. For instance, some of the high-k components contained in the dielectric layer 220 may not be sufficiently stable at elevated temperatures and may tend to readily diffuse. Consequently, the barrier layer 225 may sufficiently prevent those components from diffusing into adjacent regions. Advantageously, the thickness of the barrier layer 225 is selected so as to provide a sufficient barrier property without unduly compromising the overall permittivity of the layer stack formed by the dielectric layer 220 and the barrier layer 225. In some embodiments, a silicon dioxide and/or a silicon nitride layer with a thickness of 3–10 nm may sufficiently prevent high-k materials from diffusing into adjacent regions. Moreover, in other embodiments, the barrier layer 225 may be doped during the formation of the layer 225 or may remain undoped until an anneal cycle is carried out in order to introduce dopants 221 from the dielectric layer 220 into the active region 203.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of forming a field effect transistor, the method comprising:
    forming a doped high-k dielectric layer over a substrate including a gate electrode formed above an active region and separated therefrom by a gate insulation layer;
    heat treating said substrate to diffuse dopants from said doped high-k dielectric layer into said active region to form extension regions;
    patterning said doped high-k dielectric layer to form sidewall spacers at sidewalls of said gate electrode; and
    performing an ion implantation process using said sidewall spacers as an implantation mask to form source and drain regions of said field effect transistor.

2. The method of claim 1, wherein forming said doped high-k dielectric layer includes depositing a high-k dielectric layer in the presence of at least one dopant material.

3. The method of claim 1, wherein forming said doped high-k dielectric layer includes depositing a high-k dielectric layer and introducing dopants into said high-k dielectric layer by at least one of ion implantation and diffusion from a sacrificial layer.

4. The method of claim 1, wherein said doped high-k dielectric layer comprises a high-k dielectric material and wherein a dopant concentration of said doped high-k dielectric layer is approximately in the range of a solid solubility of the dopant in said high-k dielectric material or above.

5. The method of claim 1, wherein patterning said doped high-k dielectric layer is carried out prior to heat treating said substrate.

6. The method of claim 1, wherein said substrate is heat treated after said ion implantation process so as to simultaneously activate dopants introduced by said ion implantation process and cure lattice damage.

7. The method of claim 1, further comprising forming a dielectric barrier layer prior to the formation of said doped high-k dielectric layer.

8. The method of claim 1, wherein heat treating said substrate is carried out at a temperature in the range of approximately 800–1200° C.

9. The method of claim 8, wherein a duration of said heat treatment is in the range of approximately 10 seconds to 30 minutes.

10. The method of claim 1, wherein said doped high-k dielectric layer comprises one of an oxide and a silicate of at least one of tantalum, zirconium, hafnium, lanthanum, yttrium and strontium.

11. A method of forming a field effect transistor, the method comprising:
    performing an ion implantation process to form source and drain regions in an active region formed in a substrate, said substrate including a gate electrode formed over said active region and separated therefrom by a gate insulation layer, said gate electrode having sidewall spacers formed on sidewalls thereof;
    removing said sidewall spacers;
    forming a doped high-k dielectric layer over said substrate;
    annealing said substrate to introduce dopants from said doped high-k dielectric layer into said active region; and
    patterning said doped high-k dielectric layer to form high-k dielectric sidewall spacers at sidewalls of said gate electrode.

12. The method of claim 11, wherein annealing said substrate is carried out such that dopants introduced during said ion implantation process are activated and lattice damage caused by said ion implantation process is at least partially cured.

13. The method of claim 11, wherein forming said doped high-k dielectric layer includes depositing a high-k dielectric layer in the presence of at least one dopant material.

14. The method of claim 11, wherein forming said doped high-k dielectric layer includes depositing a high-k dielectric layer and introducing dopants into said high-k dielectric layer by at least one of ion implantation and diffusion from a sacrificial layer.

15. The method of claim 11, wherein said doped high-k dielectric layer comprises a high-k dielectric material and wherein a dopant concentration of said doped high-k dielectric layer is approximately in the range of a solid solubility of the dopant in said high-k dielectric material or above.

16. The method of claim 11, wherein patterning said doped high-k dielectric layer is carried out prior to annealing the substrate.

17. The method of claim 11, further comprising forming a dielectric barrier layer prior to the formation of said doped high-k dielectric layer.

18. The method of claim 11, wherein annealing said substrate is carried out at a temperature in the range of approximately 800–1200° C.

19. The method of claim 18, wherein a duration of said annealing is in the range of approximately 10 seconds to 30 minutes.

20. The method of claim 11, wherein said doped high-k dielectric layer comprises one of an oxide and a silicate of at least one of tantalum, zirconium, hafnium, lanthanum, yttrium and strontium.

21. A method of forming a shallow doped semiconductor region below a dielectric region, the method comprising:

forming a dielectric layer over said semiconductor region, said dielectric layer comprising an oxide of at least one of tantalum, zirconium, hafnium, lanthanum, yttrium and strontium;

introducing a dopant material into said dielectric layer;

annealing the substrate to diffuse dopant material from said dielectric layer into said semiconductor region; and patterning said dielectric layer to form a dielectric region above said doped semiconductor region;

wherein charge carrier accumulation below said dielectric region is enhanced in the presence of an external electric field due to said dielectric region.

22. The method of claim 21, wherein introducing a dopant into said dielectric layer includes depositing said dielectric layer in the presence of at least one dopant material.

23. The method of claim 21, wherein introducing a dopant into said dielectric layer includes at least one of ion implantation and diffusion from a sacrificial layer.

24. The method of claim 21, wherein a dopant concentration of said doped dielectric layer is approximately in the range of a solid solubility of the dopant in said dielectric layer or above.

25. The method of claim 21, wherein patterning said dielectric layer is carried out prior to annealing the substrate.

26. The method of claim 21, further comprising forming a dielectric barrier layer prior to the formation of said dielectric layer.

27. The method of claim 21, wherein annealing the substrate is carried out at a temperature in the range of approximately 800–1200° C.

28. The method of claim 27, wherein a duration of said annealing process is in the range of approximately 10 seconds to 30 minutes.

* * * * *